US010840117B2

(12) United States Patent
Kitabayashi et al.

(10) Patent No.: US 10,840,117 B2
(45) Date of Patent: Nov. 17, 2020

(54) HOLDING APPARATUS

(71) Applicant: NGK SPARK PLUG CO., LTD., Nagoya (JP)

(72) Inventors: Tetsuo Kitabayashi, Sendai (JP); Makoto Hino, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 279 days.

(21) Appl. No.: 15/696,301

(22) Filed: Sep. 6, 2017

(65) Prior Publication Data

US 2018/0076067 A1 Mar. 15, 2018

(30) Foreign Application Priority Data

Sep. 12, 2016 (JP) ................ 2016-178070
Sep. 12, 2016 (JP) ................ 2016-178071

(51) Int. Cl.
*H05B 3/68* (2006.01)
*C23C 16/00* (2006.01)
(Continued)

(52) U.S. Cl.
CPC .. *H01L 21/67248* (2013.01); *H01L 21/67103* (2013.01); *H01L 21/68785* (2013.01); *H01L 21/68792* (2013.01); *H01L 21/68757* (2013.01)

(58) Field of Classification Search
CPC ........ H01L 21/67098–67115; H01L 21/67248; H01L 21/68757; H01L 21/68785; H01L 21/68714–68792
(Continued)

(56) References Cited

U.S. PATENT DOCUMENTS 5,688,331 A 11/1997 Aruga et al.
2004/0149719 A1* 8/2004 Nakamura ........ H01L 21/67103
219/444.1
(Continued)

FOREIGN PATENT DOCUMENTS

JP H7-153706 A 6/1995
JP 4282221 B2 6/2009
(Continued)

OTHER PUBLICATIONS

English translation of JP4282221 (Year: 2009).*
(Continued)

*Primary Examiner* — Sang Y Paik
(74) *Attorney, Agent, or Firm* — Stites & Harbison, PLLC; Jeffrey A. Haeberlin; James R. Hayne

(57) ABSTRACT

A ceramic heater includes a plate-shaped base with an upper surface and a lower surface, a tubular shaft with an upper end surface connected to the lower surface of the base and a lower end surface, resistive heating elements embedded in the base, a first hole extending in the base along the upper surface of the base, and a second hole extending from the lower end surface or an inner surface of the shaft toward the upper end surface. A third hole connecting the first hole and the second hole to each other is formed continuously between the base and the shaft, and a depth of the third hole from an imaginary plane that passes through a boundary between the second hole and the third hole and that is along the upper surface of the base gradually increases in the direction to the outer edge.

7 Claims, 8 Drawing Sheets

(51) Int. Cl.
*H01L 21/67* (2006.01)
*H01L 21/687* (2006.01)

(58) Field of Classification Search
USPC .................... 219/443.1, 444.1; 118/724–729
See application file for complete search history.

(56) References Cited

U.S. PATENT DOCUMENTS

2012/0211933 A1    8/2012  Goto
2013/0284374 A1  10/2013  Lubomirsky et al.
2016/0002779 A1*  1/2016  Lin .................. H01L 21/67103
                                                                    118/500

FOREIGN PATENT DOCUMENTS

JP          5501467 B2    3/2014
JP          5597072 B2  10/2014
JP        2015517224 A    6/2015
WO     2012/039453 A1    3/2012
WO     2013/162000 A1  10/2013

OTHER PUBLICATIONS

Japan Patent Office, Office Action (Notice of Reasons for Refusal) issued in corresponding Application No. 2016-178070 dated Nov. 26, 2019.
Japan Patent Office, Office Action (Notice of Reasons for Refusal) issued in corresponding Application No. 2016-178071 dated Nov. 26, 2019.

* cited by examiner

HOLDING APPARATUS

CROSS REFERENCE TO RELATED APPLICATIONS

The present application claims priority to Japanese Patent Application Nos. 2016-178071 and 2016-178070 both of which were filed on Sep. 12, 2016, the disclosures of which are herein incorporated by reference in their entirety.

BACKGROUND OF THE INVENTION

Field of the Invention

The present invention relates to a holding apparatus that holds an object such as a semiconductor wafer.

Description of the Related Art

It has been known that a holding apparatus holds an object, such as a semiconductor wafer to be subjected to a film formation process, etching process, or other processes, on the upper surface of a ceramics base. In such a holding apparatus, the object is heated to an appropriate temperature by using, for example, a resistive heating element embedded in the base. For this reason, it is necessary for the temperature of the base to be strictly controlled, and a thermocouple is disposed in the base to measure the temperature of the base.

For example, PTL 1 discloses that a thermocouple is fitted in a metallic member disposed in a protrusion protruding from the lower surface of a susceptor block (base) to the inside of a support (shaft).

PTL 2 discloses that a pipe guide is mounted on a ceramics plate (base) in which heating elements (resistive heating elements) are embedded such that the pipe guide extends diagonally from the back surface of the ceramics plate, and that a thermocouple is disposed via the guide in a passage formed parallel to the upper surface of the ceramics plate.

PATENT LITERATURE

PTL 1 is Japanese Unexamined Patent Application Publication No. 7-153706.
PTL 2 is Japanese Patent No. 5501467.

BRIEF SUMMARY OF THE INVENTION

However, according to the technique disclosed in PTL 1, a region in which the thermocouple can be disposed is only a region located inside the shaft in a top view, and it is difficult to control the temperature of the entire base.

According to the technique disclosed in PTL 2, the guide is located inside the shaft, and the bend radius of the thermocouple is small. An increase in the bend radius increases the size of the guide. Consequently, when a terminal for supplying power to the resistive heating elements embedded in the base is mounted, the position at which the terminal is mounted is limited.

The present invention has been accomplished in view of such circumstances, and it is an object of the present invention to provide a holding apparatus that enables a thermocouple to be disposed in a desired region and that improves the degree of freedom of the position at which a terminal to be connected to the resistive heating element is disposed while ensuring the bend radius of the thermocouple.

According to a first aspect of the present invention, a holding apparatus includes a plate-shaped base that is made of ceramics and that has an upper surface and a lower surface opposite the upper surface, a tubular shaft that is made of ceramics and that has an upper end surface connected to the lower surface of the base and a lower end surface opposite the upper end surface, a resistive heating element embedded in the base, a first hole extending in the base in a first direction along the upper surface of the base, and a second hole extending from the lower end surface or an inner surface of the shaft toward the upper end surface. An object is held on the upper surface of the base. A third hole connecting the first hole and the second hole to each other is formed continuously between the base and the shaft. A depth of the third hole from an imaginary plane that passes through a boundary between the second hole and the third hole and that is along the upper surface of the base gradually increases in the first direction.

In other words, a holding apparatus includes a plate-shaped base made of ceramics with the base having an upper surface and a lower surface opposite the upper surface, a tubular shaft made of ceramics with the shaft having an upper end surface connected to the lower surface of the base and a lower end surface opposite the upper end surface, and a resistive heating element embedded in the base. An object is held on the upper surface of the base. The base defines a first hole extending in a first direction parallel to the upper surface of the base. The shaft defines a second hole extending from the lower end surface or an inner surface of the shaft toward the upper end surface. A third hole is defined continuously between the base and the shaft, with the third hole connecting the first hole and the second hole. An imaginary plane passes through a boundary between the second hole and the third hole and is parallel to the upper surface of the base, and a distance of the third hole from the imaginary plane gradually increases in the first direction.

According to the first aspect of the present invention, an end portion of a thermocouple can be inserted up to an end of the first hole in the base in the first direction, for example, near the outer edge of the base in a manner in which the thermocouple is inserted along the inner wall surface of the first to third holes. Thus, the thermocouple can be readily inserted.

The end portion of the thermocouple can be disposed in a region located outside the shaft in a top view unlike the case of the technique disclosed in PTL 1 described above. As compared with the technique disclosed in PTL 2 described above, there is no members, such as a guide, in the shaft, and accordingly, the degree of freedom of the position at which the terminal to be connected to the resistive heating element is disposed can be improved.

In the first aspect of the present invention, a part of the third hole that is formed in the base preferably has an opening that opens to the lower surface of the base, and a projected region of the part of the third hole that is formed in the base in a direction from the upper surface of the base to the lower surface is preferably contained in a region in which the opening is formed. In other words, a part of the third hole defined by the base has an opening at the lower surface of the base, and a projected region of the part of the third hole defined by the base in a direction from the upper surface of the base to the lower surface is contained in a region of the opening.

In this case, the part is in the form of a groove, which is readily formed by cutting work.

In the first aspect of the present invention, the second hole preferably extends from the lower end surface to the upper end surface, and a part of the second hole that is located above a boundary between the second hole and the third hole is preferably filled with a member different from the shaft.

In this case, since the second hole extends from the lower end surface of the shaft to the upper end surface, the second hole can be readily formed by cutting work. In addition, since the part of the second hole that is located above the boundary between the second hole and the third hole is filled with the member different from the shaft, the thermocouple can be prevented from being misguided to the part of the second hole that is located above the boundary between the second hole and the third hole.

In the first aspect of the present invention, it is preferable that the part of the third hole that is formed in (i.e., defined by) the base have a linear first axis, a part of the third hole that is formed in (i.e., defined by) the shaft have a linear second axis, and an angle formed between the first direction and a direction of the first axis be less than an angle formed between the first direction and a direction of the second axis.

In this case, the location at which the thermocouple bends is one more than in the case where the entire third hole has the same linear axis, an angle at which the thermocouple bends at a bent portion can be increased, and a risk of the occurrence of a failure such as damage of the thermocouple can be reduced.

According to a second aspect of the present invention, a holding apparatus includes a plate-shaped base that is made of ceramics and that has an upper surface and a lower surface opposite the upper surface, a resistive heating element embedded in the base, a first hole extending in the base in a first direction along the upper surface of the base, and a second hole that has an opening that opens to the lower surface of the base and that is connected to the first hole. An object is held on the upper surface of the base. A depth of the second hole from an imaginary plane including the lower surface of the base gradually increases in the first direction.

In other words, a holding apparatus includes a plate-shaped base made of ceramics, with the base having an upper surface and a lower surface opposite the upper surface, and a resistive heating element embedded in the base. An object is held on the upper surface of the base. The base defines a first hole extending in a first direction along the upper surface of the base. The base defines a second hole that is connected to the first hole and has an opening at the lower surface of the base. An imaginary plane includes the lower surface of the base, and a distance of the second hole from the imaginary plane gradually increases in the first direction According to the second aspect of the present invention, the end portion of the thermocouple can be inserted in a desired region in the base in a manner in which the thermocouple is inserted along the inner wall surface of the first and second holes. Thus, the thermocouple can be readily inserted.

The end portion of the thermocouple can be disposed in a region located outside the shaft in a top view unlike the case of the technique disclosed in PTL 1 described above. As compared with the technique disclosed in PTL 2 described above, there is no members, such as a guide, and accordingly, the degree of freedom of the position at which the terminal to be connected to the resistive heating element is disposed can be improved.

In the second aspect of the present invention, a projected region of the second hole in a direction from the upper surface of the base to the lower surface is preferably contained in a region in which the opening is formed (i.e., a region of the opening).

In this case, the second hole is in the form of a groove, which is readily formed by cutting work.

In the second aspect of the present invention, the holding apparatus preferably includes a tubular shaft having an upper end surface connected to the lower surface of the base and a lower end surface opposite the upper end surface, and a third hole that extends from the lower end surface or an inner surface of the shaft toward the upper end surface and that is connected to the second hole is preferably formed.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
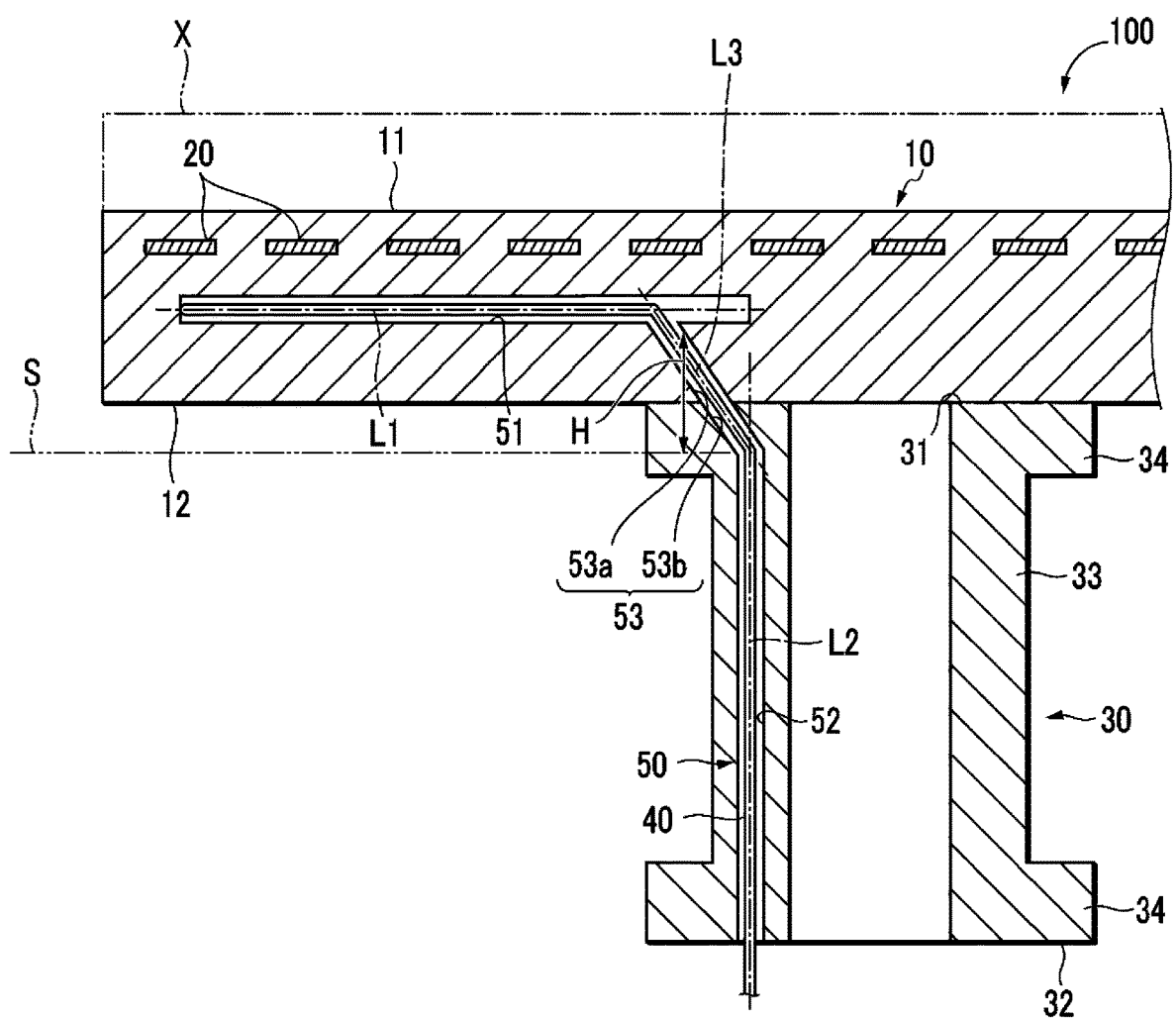
FIG. 1 is a schematic sectional view of a ceramic heater according to a first embodiment of the present invention.

A ceramic heater 100 corresponding to a holding apparatus according to a first embodiment of the present invention will now be described with reference to FIG. 1.

The ceramic heater 100 includes a base 10 made of substantially disk-shaped ceramics for holding an object X such as a wafer (substrate), resistive heating elements 20 embedded in the base 10, and a tubular shaft 30 connected to the lower surface of the base 10.

The base 10 has an upper surface (front surface) 11 on which the object X is held and a lower surface (back surface) 12 opposite the upper surface 11. A large number of protrusions are formed on the upper surface 11, and the object X is held on the upper surface of each protrusion, although this is not illustrated.

The base 10 has a sintered ceramic body made of, for example, alumina, aluminum nitride, or silicon nitride. The base 10 may be manufactured in a manner in which the above material is entered into a mold having a predetermined shape and molded into a disk shape by, for example, hot-press sintering for densifying.

According to the first embodiment, the resistive heating elements 20 are each made of meshes of, for example, a refractory metal such as molybdenum (Mo) or tungsten (W) and has a sheet shape. The resistive heating elements 20, however, may be in the form of a film, a plate, a line, a foil, fibers, a coil, or a ribbon that is made of, for example, a refractory metal, or in the form of a spiral or a folded body.

The base 10 in which the resistive heating elements 20 are embedded is manufactured in a manner in which the above materials of the base 10 interposing the resistive heating elements 20 therebetween are sintered.

In addition to the resistive heating elements 20, at least one of an electrostatic chuck electrode and a plasma electrode may be embedded in the base 10. The electrostatic chuck electrode attracts a wafer to the upper surface (holding surface) 11 with a Coulomb force. The plasma electrode generates plasma above the base 10.

The shaft 30 is substantially cylindrical and has an upper end surface 31 connected to the lower surface 12 of the base 10 at a central portion of the base 10 and a lower end surface 32 opposite the upper end surface 31.

The shaft 30 includes a cylindrical portion 33 at a central portion thereof in the vertical direction and enlarged-diameter portions 34, each of which has a diameter larger than that of the cylindrical portion 33 at upper and lower end portions thereof. The upper end surface 31 of the shaft 30 is formed of the upper end surface of the cylindrical portion 33 and the upper end surface of one of the enlarged-diameter portions 34 and corresponds to an interface between the shaft 30 and the base 10.

The lower surface 12 of the base 10 and the upper end surface 31 of the shaft 30 are joined by diffusion welding or solid-state welding with a material such as ceramics or glass. The base 10 and the shaft 30 may be connected to each other by, for example, screwing or brazing.

The material of the shaft 30 may be the same as that of the base 10 or may be a material having a thermal conductivity less than that of the material of the base 10 to increase thermal insulation.

The ceramic heater 100 also includes terminals, not illustrated, for supplying power to the respective resistive heating elements 20. Power supply members, not illustrated, which are embedded in the base 10, are connected to the respective terminals. Power-supply lines in the form of a rod or a wire, not illustrated, which extend through a hollow portion of the shaft 30, are connected to the respective power supply members. The power-supply lines are connected to a power supply, not illustrated.

The terminals and the power supply members are mechanically fastened together, are brazed, or are welded. Each terminal is composed of a refractory metal in the form of a foil, a plate, or a lump such as nickel (Ni), Kovar (registered trademark) (Fe—Ni—Co), molybdenum (Mo), or tungsten (W) or a refractory alloy whose main component is molybdenum (Mo) and tungsten (W). A power supplying member is made of, for example, molybdenum (Mo) or tungsten (W).

A hole 50 through which a thermocouple 40 is disposed is formed in the base 10 and the shaft 30.

In the thermocouple 40, thermocouple wires are inserted in a sheath, the thermocouple wires are insulated from each other with an insulating material, and the thermocouple wires and the sheath are insulated from each other with an insulating material, although the detailed structure thereof is not illustrated. An end portion of the thermocouple 40 is secured so as to be in contact with an end of the hole 50. In FIG. 1, the thermocouple 40 is illustrated as a single member, but a plurality of the thermocouples 40 may be disposed therein. In this case, a plurality of the holes 50 are formed such that there is a one-to-one correspondence between the thermocouples 40 and the holes 50.

In the base 10, a first hole 51 is formed as a part of the hole 50 so as to extend in a first direction along the upper surface 11 of the base 10. The first hole 51 is formed so as to extend in the base 10 and, according to the first embodiment, to be parallel to the upper surface 11, that is, horizontally toward the outer edge of the base 10. An end of the first hole 51 is located nearer than a joint between the base 10 and the shaft 30 to the outer edge of the base 10.

In the shaft 30, a second hole 52 is formed as a part of the hole 50. The second hole 52 is formed in the cylindrical portion 33 of the shaft 30 and, according to the first embodiment, extends in the vertical direction. A lower end portion of the second hole 52 opens to the lower end surface 32 of the shaft 30. An upper end portion of the second hole 52 is located inside the upper end surface 31 of the shaft 30.

A third hole 53 connecting the first hole 51 and the second hole 52 to each other is formed as a part of the hole 50 continuously between the base 10 and the shaft 30. According to the first embodiment, an end of the third hole 53 is connected to an intermediate part of the first hole 51 that is located above the enlarged-diameter portions 34, and the other end thereof is connected to the upper end portion of the second hole 52.

An end portion of a part 53a of the third hole 53 that is formed in the base 10 is located on an interface between the lower surface 12 of the base 10 and the upper end surface 31 of the shaft 30. In FIG. 1, an end portion of a part 53b of the third hole 53 formed in the shaft 30 is located on the upper end surface of one of the enlarged-diameter portions 34 of the shaft 30. The end portion of the part 53b may be located on both the upper end surface of the cylindrical portion 33 and the upper end surface of the enlarged-diameter portions 34, or on the upper end surface of the cylindrical portion 33.

The first to third holes 51 to 53 are formed such that the axes L1 to L3 thereof are linear. The first to third holes 51 to 53 have the same sectional shape or similar sectional shapes and, according to the first embodiment, the sectional shape thereof is a circular shape. The first to third holes 51 to 53 may have different sectional shapes, and the sectional shape thereof may be a polygonal shape such as a rectangular shape or an elliptical shape instead of a circular shape.

In the base 10, a depth H of the third hole 53 from an imaginary plane S that passes through a boundary between the second hole 52 and the third hole 53 and that is along the upper surface 11 of the base 10 gradually increases in a direction in which the first hole 51 extends. According to the first embodiment, the axis L3 of the third hole 53 is linear, and the depth H gradually increases at a constant rate in the direction to the outer circumference of the base 10.

The axis L3 of the third hole 53 is inclined at a predetermined angle with respect to the axes L1 and L2 of the first and second holes 51 and 52, for example, at 135 degrees in FIG. 1. The axis L3 of the third hole 53 may be inclined at different angles with respect to the axes L1 and L2 of the first and second holes 51 and 52.

An operator inserts the thermocouple 40 from the opening of the second hole 52 at the lower end surface 32 of the shaft 30 into the inside of the hole 50 in the ceramic heater 100 having the above structure.

When inserted, the thermocouple 40 first enters the second hole 52 straight upward, bends at a bent portion between the second hole 52 and the third hole 53, for example, at 45 degrees according to the first embodiment, and heads diagonally upward toward the end of the third hole 53 along the upper surface of the third hole 53.

Subsequently, the thermocouple 40 bends at a boundary between the first hole 51 and the third hole 53, for example, at 45 degrees according to the first embodiment, and heads outward toward an end of the first hole 51 along the upper surface of the first hole 51. When the end portion of the thermocouple 40 reaches the end of the first hole 51, insertion of the thermocouple 40 is completed.

Thus, the thermocouple 40 is readily inserted up to the end along the inner wall surface of the first to third holes 51 to 53. The thermocouple 40 has two bent portions at the boundaries between the first to third holes 51 to 53. An angle at which the bent portions bend is 135 degrees, and a long distance is ensured between the bent portions. The reason is that the third hole 53 is formed continuously between the base 10 and the shaft 30 and, in particular, the third hole 53 is partially formed in the enlarged-diameter portion 34 near the upper end surface 31 of the shaft 30.

This enables the thermocouple 40 to be disposed in a region located outside the shaft 30 in a top view unlike the case of the technique disclosed in PTL 1 described above. As compared with the technique disclosed in PTL 2 described above, there is no members, such as a guide, in the shaft 30, and a large number of the thermocouples 40 can be disposed therein.

In addition, there is no need to maintain a space for disposing a member, such as a guide, in the shaft 30, and the outer diameter of the shaft 30 can be smaller than that of a conventional one. Accordingly, the area of the interface between the shaft 30 and the base 10 can be smaller than that of a conventional one. Consequently, when the resistive heating elements 20 generate heat, heat conduction through the shaft 30 is suppressed more than a conventional case, and the temperature of the upper surface 11 of the base 10 can be uniform.

Figure 2:
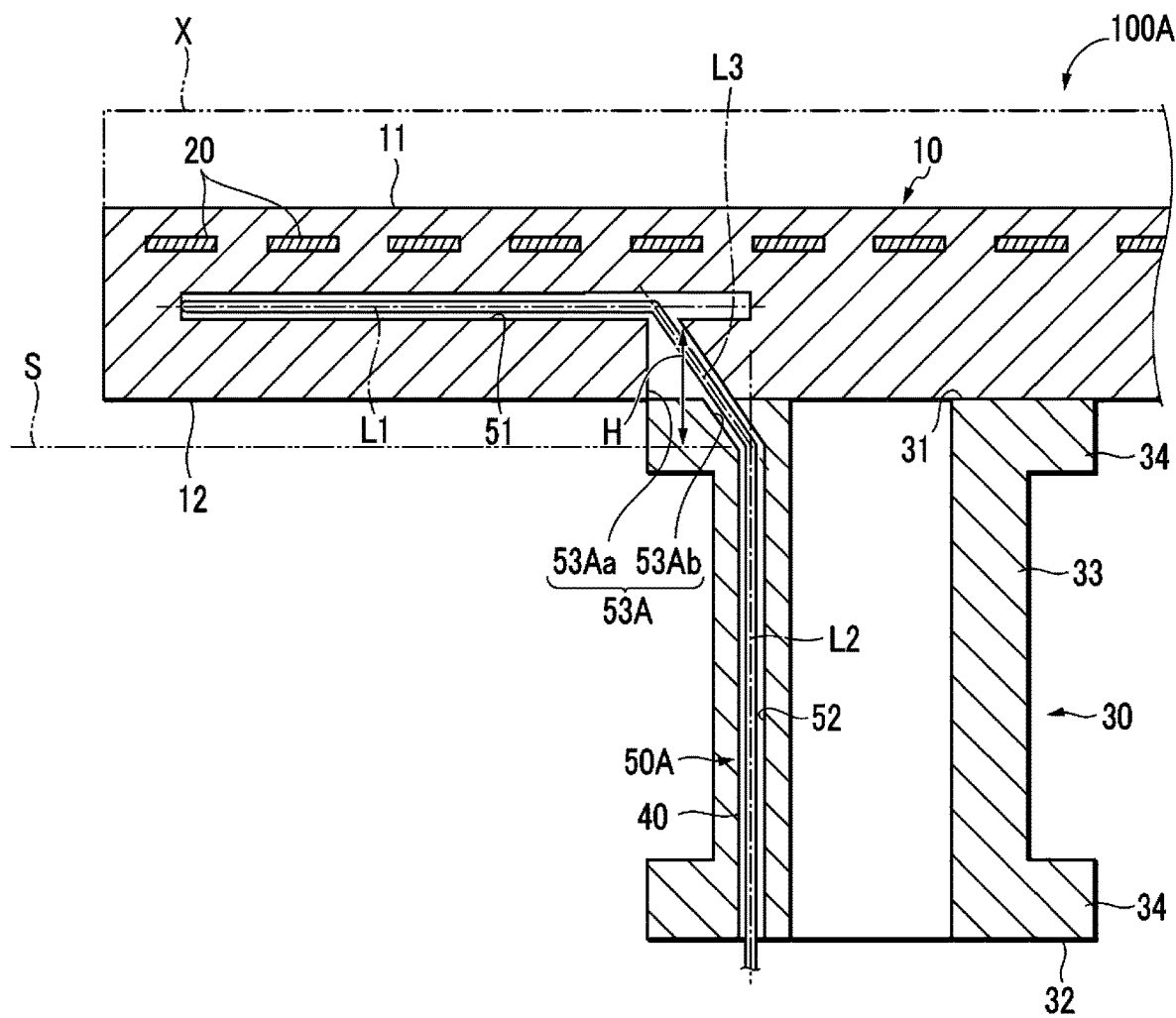
FIG. 2 is a schematic sectional view of a ceramic heater according to a modification to the first embodiment of the present invention.

A ceramic heater 100A corresponding to a holding apparatus according to a modification to the first embodiment of the present invention will now be described with reference to FIG. 2.

The difference between the ceramic heater 100A and the above ceramic heater 100 is a hole 50A only, and a description of the other structures is omitted.

First and second holes 51 and 52 of the hole 50A are the same as the first and second holes 51 and 52 of the hole 50.

A third hole 53A of the hole 50A connecting the first hole 51 and the second hole 52 to each other is formed continuously between the base 10 and the shaft 30 as in the case of the third hole 53 of the hole 50. In the base 10, a depth H of the third hole 53A from an imaginary plane S that passes through a boundary between the second hole 52 and the third hole 53A and that is along the upper surface 11 of the base 10 gradually increases in the direction to the outer edge of the base 10.

A part 53Ab of the third hole 53A that is formed in the shaft 30 is the same as the part 53b of the above third hole 53 that is formed in the shaft 30. However, a part 53Aa of the third hole 53A that is formed in the base 10 differs from the part 53a of the above third hole 53 that is formed in the base 10 and is in the form of a groove.

Specifically, a projected region of the part 53Aa in the direction from the upper surface 11 of the base 10 to the lower surface 12 matches a region in which the opening of the part 53Aa at the lower surface 12 of the base 10 is formed.

In the case where the part 53Aa is thus formed, the part 53Aa, which is in the form of a groove, can be more readily processed than the part 53a, which needs a drilling process from a diagonal direction.

The part 53Aa is formed in a region containing the region in which the part 53a is formed. When the thermocouple 40 is inserted, the thermocouple 40 moves while being in contact with the upper surface of the part 53Aa, and the thermocouple 40 is readily inserted as in the above first embodiment.

The part 53Aa may be partially in the form of a groove, and the projected region of the part 53Aa in the direction from the upper surface 11 of the base 10 to the lower surface 12 may be contained in the region in which the opening of the part 53Aa at the lower surface 12 of the base 10 is formed, although this is not illustrated.

The part 53Ab of the third hole 53A that is formed in the shaft 30 may differ from the part 53b of the above third hole 53 that is formed in the shaft 30 and may be in the form of a groove, although this is not illustrated.

Specifically, a projected region of the part 53Ab in the direction from the lower end surface 32 of the shaft 30 to the upper end surface 31 may match or be contained in a region in which the opening of the part 53Ab at the upper end surface 31 of the shaft 30 is formed. In this case, an upper end portion of the second hole 52 and the part 53Ab of the third hole 53A that is formed in the shaft 30 are formed integrally with each other and are in the form of a groove in combination.

The part of the third hole 53A that is formed in the base 10 may be the same as the part 53a or the part 53Aa.

In the case where the part 53Ab is thus formed, the part 53Ab, which is in the form of a groove, is more readily processed than the part 53b, which needs a drilling process from a diagonal direction.

Figure 3:
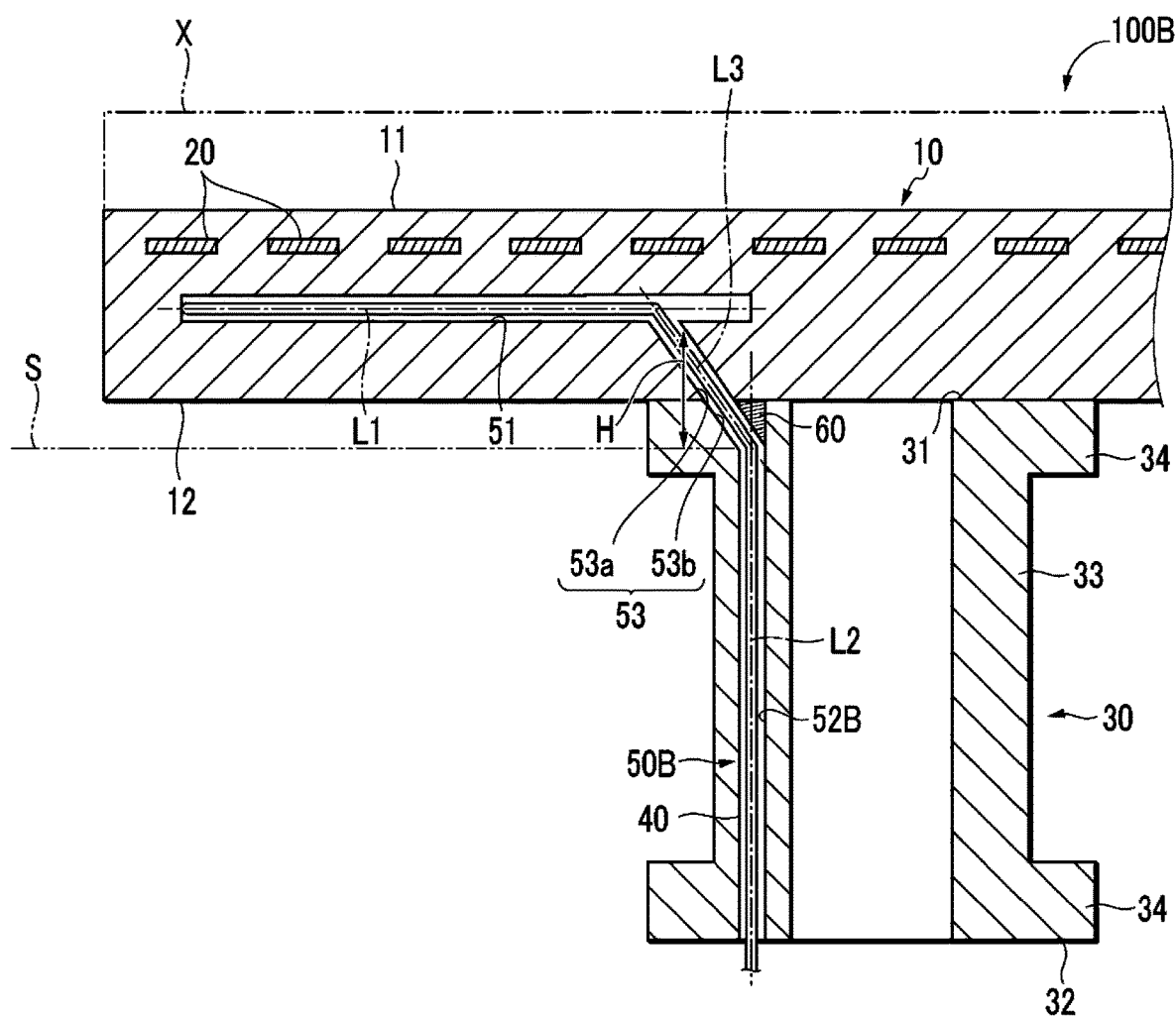
FIG. 3 is a schematic sectional view of a ceramic heater according to another modification to the first embodiment of the present invention.

A ceramic heater 100B corresponding to a holding apparatus according to another modification to the first embodiment of the present invention will now be described with reference to FIG. 3.

The difference between the ceramic heater 100B and the above ceramic heaters 100 and 100A is a hole 50B only, and a description of the other structures is omitted.

First and third holes 51 and 53 of the hole 50B are the same as the first and third holes 51 and 53 of the hole 50 but may be the same as the first and third holes 51 and 53A of the hole 50A.

A second hole 52B of the hole 50B has an opening at the upper end surface 31 of the shaft 30 and is formed so as to extend through the cylindrical portion 33 of the shaft 30 in the vertical direction.

In the case where the second hole 52B is thus formed of a linear hole only, the second hole 52B is more readily processed than in the case of forming the second hole 52, which needs to stop a drilling process at an intermediate position of the shaft 30.

A part of the second hole 52B that is located above a boundary between the second hole 52B and the third hole 53 is filled with a member 60 made of, for example, ceramics or a refractory metal different from the shaft 30. This part may be entirely or partially filled with the member 60.

The member 60 is secured in the second hole 52B, for example, with an adhesive. The member 60, however, may be inserted in the second hole 52B and temporally secured thereto only while the thermocouple 40 is inserted.

The hole 50B thus formed has the same function as the hole 50 and achieves the same effect as the hole 50.

A ceramic heater 100C corresponding to a holding apparatus according to another modification to the first embodiment of the present invention will now be described with reference to FIG. 4.

The difference between the ceramic heater 100C and the above ceramic heater 100 is a hole 50C only, and a description of the other structures is omitted.

First and second holes 51 and 52 of the hole 50C are the same as the first and second holes 51 and 52 of the hole 50.

A third hole 53C of the hole 50C connecting the first hole 51 and the second hole 52 to each other is formed continuously between the base 10 and the shaft 30 as in the case of the third hole 53 of the hole 50. In the base 10, a depth H of the third hole 53C from an imaginary plane S that passes through a boundary between the second hole 52 and the third hole 53C and that is along the upper surface 11 of the base 10 gradually increases in the direction to the outer edge of the base 10.

A first axis L3a, which is the axis of a part 53Ca of the third hole 53C that is formed in the base 10, differs from a second axis L3b, which the axis of a part 53Cb formed in the shaft 30.

Figure 4:
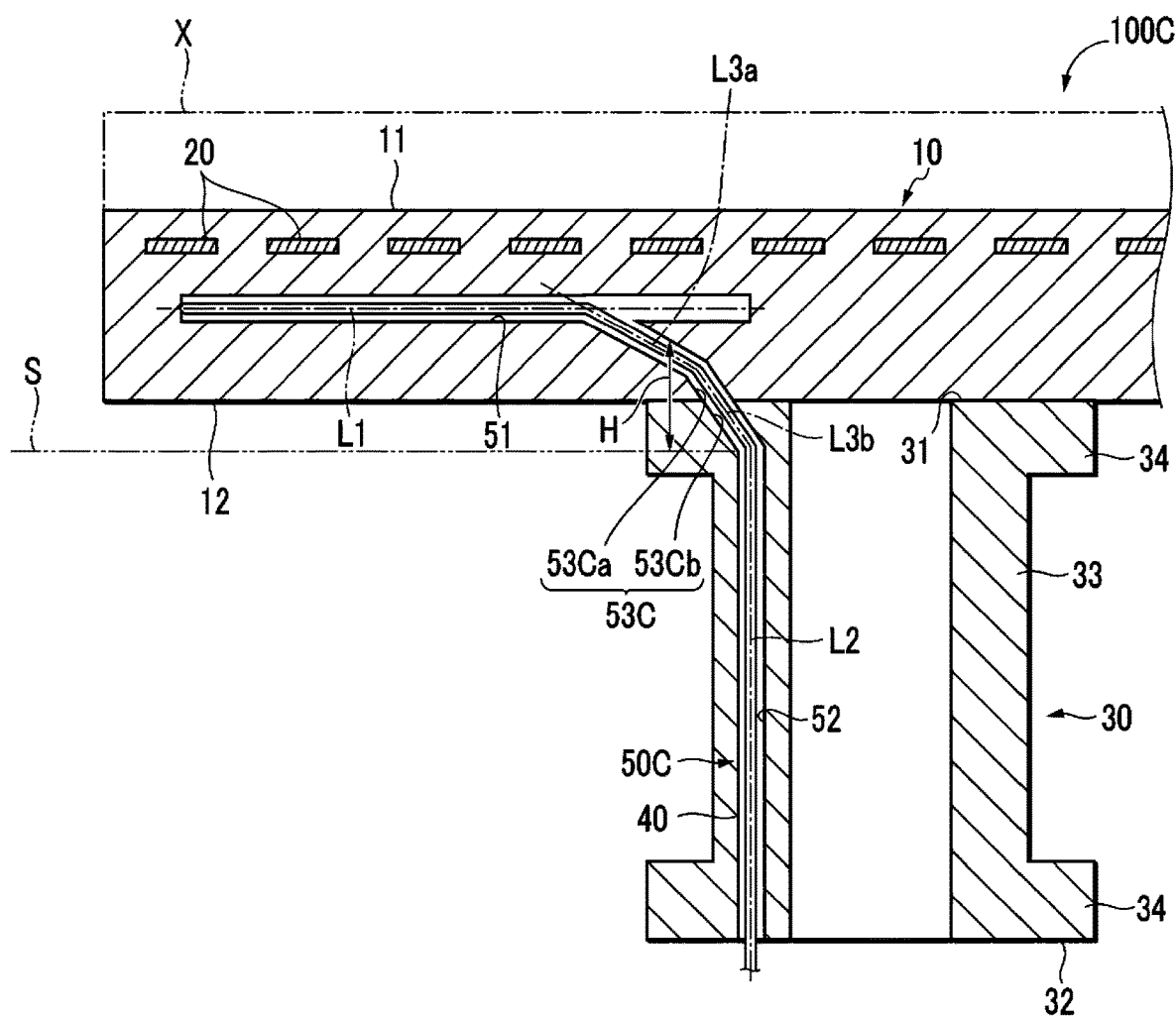
FIG. 4 is a schematic sectional view of a ceramic heater according to another modification to the first embodiment of the present invention.

The first axis L3a is inclined at a predetermined first angle, for example, at 30 degrees in FIG. 4, with respect to the direction to the outer edge of the base 10, that is, the horizontal direction. The second axis L3b is inclined at a predetermined second angle larger than the first angle, for example, at 60 degrees in FIG. 4, with respect to the horizontal direction. However, the first and second axes L3a and L3b may be inclined at different angles with respect to the first and second holes 51 and 52.

The opening of the part 53Ca at the lower surface 12 of the base 10 matches the opening of the part 53Cb at the upper end surface 31 of the shaft 30.

In the ceramic heater 100C having the above structure, there are three bent portions, an angle at which the bent portions bend is 150 degrees, and a sufficient distance can be ensured between the bent portions.

In the ceramic heater 100C, the first hole 51 or the second hole 52 can be in the form of a groove as in the case of the ceramic heater 100A. The second hole 52 can be a through-hole and filled with the member 60 as in the case of the ceramic heater 100B.

In the ceramic heater 100C, the third hole 53C may include a part horizontally extending in at least one of the base 10 and the shaft 30.

The first embodiment of the present invention is described above, but the present invention is not limited thereto.

For example, although the axes of the first to third holes 51 to 53 are linear according to the first embodiment, the axes are not limited thereto and may be curved or partially curved.

Although the lower end portion of the second hole 52 opens to the lower end surface 32 of the shaft 30 according to the first embodiment, the lower end portion is not limited thereto and may open to the inner surface of the shaft 30.

Figure 5:
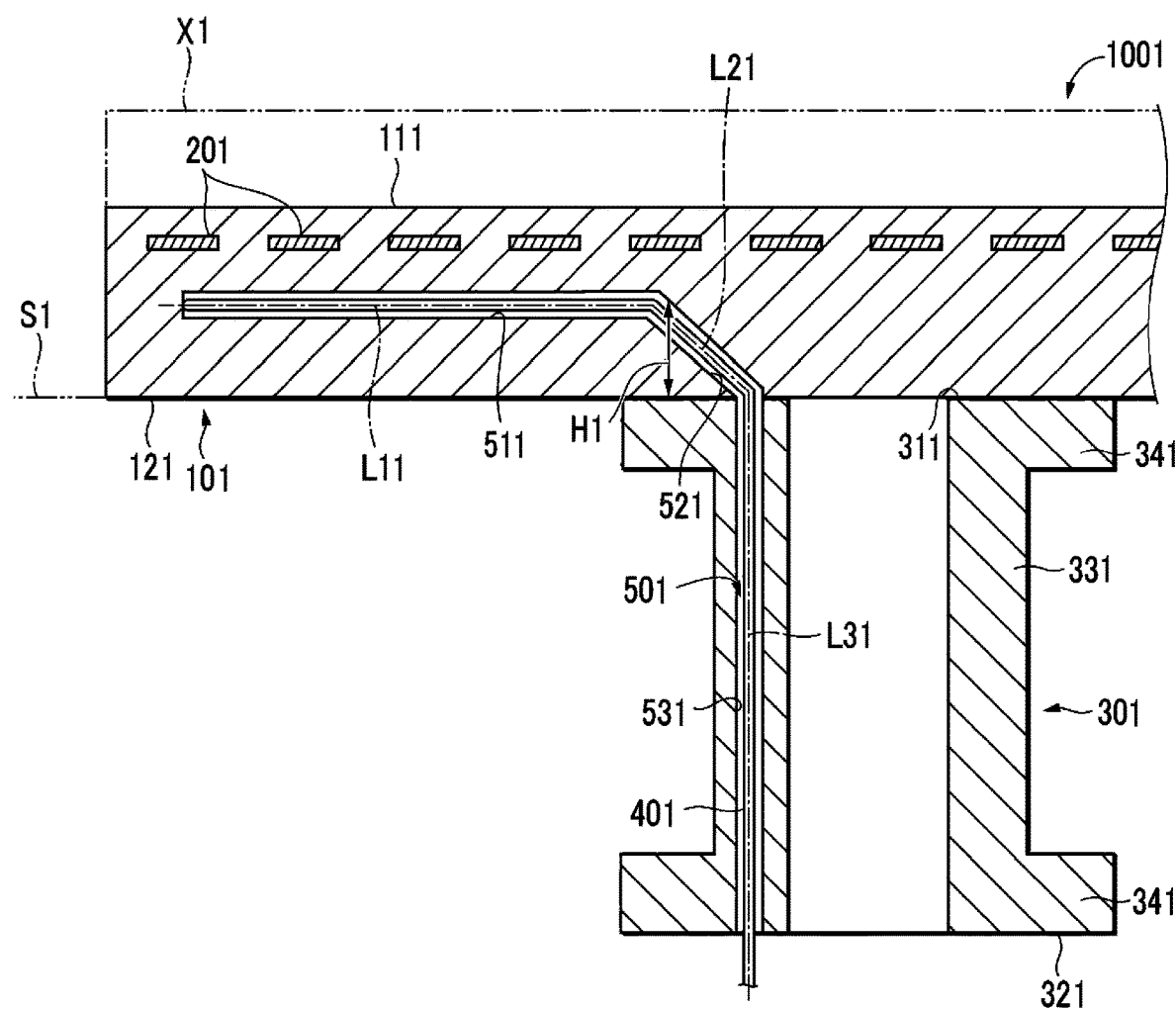
FIG. 5 is a schematic sectional view of a ceramic heater according to a second embodiment of the present invention.

A ceramic heater 1001 corresponding to a holding apparatus according to a second embodiment of the present invention will now be described with reference to FIG. 5.

The ceramic heater 1001 includes a base 101 made of substantially disk-shaped ceramics for holding an object X1 such as a wafer (substrate), resistive heating elements 201 embedded in the base 101, and a tubular shaft 301 connected to the lower surface of the base 101.

The base 101 has an upper surface (front surface) 111 on which the object X1 is held and a lower surface (back surface) 121 opposite the upper surface 111. A large number of protrusions are formed on the upper surface 111, and the object X1 is held on the upper surface of each protrusion, although this is not illustrated.

The base 101 has a sintered ceramic body made of, for example, alumina, aluminum nitride, or silicon nitride. The base 101 may be manufactured in a manner in which the above material is entered into a mold having a predetermined shape and molded into a disk shape by, for example, hot-press sintering for densifying.

According to the second embodiment, the resistive heating elements 201 are each made of meshes of, for example, a refractory metal such as molybdenum (Mo) or tungsten (W) and has a sheet shape. The resistive heating elements 201, however, may be in the form of a film, a plate, a line, a foil, fibers, a coil, or a ribbon that is made of, for example, a refractory metal, or in the form of a spiral or a folded body.

The base 101 in which the resistive heating elements 201 are embedded is manufactured in a manner in which the above materials of the base 101 interposing the resistive heating elements 201 therebetween are sintered.

In addition to the resistive heating elements 201, at least one of an electrostatic chuck electrode and a plasma electrode may be embedded in the base 101. The electrostatic chuck electrode attracts a wafer to the upper surface (holding surface) 111 with a Coulomb force. The plasma electrode generates plasma above the base 101.

The shaft 301 is substantially cylindrical and has an upper end surface 311 connected to the lower surface 121 of the base 101 at a central portion of the base 101 and a lower end surface 321 opposite the upper end surface 311.

The shaft 301 includes a cylindrical portion 331 at a central portion thereof in the vertical direction and enlarged-diameter portions 341, each of which has a diameter larger than that of the cylindrical portion 331 at upper and lower end portions thereof. The upper end surface 311 of the shaft 301 is formed of the upper end surface of the cylindrical portion 331 and the upper end surface of one of the enlarged-diameter portions 341 and corresponds to an interface between the shaft 301 and the base 101.

The lower surface 121 of the base 101 and the upper end surface 311 of the shaft 301 are joined by diffusion welding or solid-state welding with a material such as ceramics or glass. The base 101 and the shaft 301 may be connected to each other by, for example, screwing or brazing.

The material of the shaft 301 may be the same as that of the base 101 or may be a material having a thermal conductivity less than that of the material of the base 101 to increase thermal insulation.

The ceramic heater 1001 also includes terminals, not illustrated, for supplying power to the respective resistive heating elements 201. Power supply members, not illustrated, which are embedded in the base 101, are connected to the respective terminals. Power-supply lines in the form of a rod or a wire, not illustrated, which extend through a hollow portion of the shaft 301, are connected to the respective power supply members. The power-supply lines are connected to a power supply, not illustrated.

The terminals and the power supply members are mechanically fastened together, are brazed, or are welded. Each terminal is composed of a refractory metal in the form of a foil, a plate, or a lump such as nickel (Ni), Kovar (registered trademark) (Fe—Ni—Co), molybdenum (Mo), or tungsten (W) or a refractory alloy whose main component is molybdenum (Mo) and tungsten (W). A power supplying member is made of, for example, molybdenum (Mo) or tungsten (W).

A hole 501 through which a thermocouple 401 is disposed is formed in the base 101 and the shaft 301.

In the thermocouple 401, thermocouple wires are inserted in a sheath, the thermocouple wires are insulated from each other with an insulating material, and the thermocouple wires and the sheath are insulated from each other with an insulating material, although the detailed structure thereof is not illustrated. An end portion of the thermocouple 401 is secured so as to be in contact with an end of the hole 501. In FIG. 5, the thermocouple 401 is illustrated as a single member, but a plurality of the thermocouples 401 may be disposed therein. In this case, a plurality of the holes 501 are formed such that there is a one-to-one correspondence between the thermocouples 401 and the holes 501.

In the base 101, a first hole 511 is formed as a part of the hole 501 so as to extend in the first direction along the upper surface 111 of the base 101. The first hole 511 is formed so as to extend in the base 101 and, according to the second embodiment, to be parallel to the upper surface 111, that is, horizontally toward the outer edge of the base 101. An end of the first hole 511 is located nearer than a joint between the base 101 and the shaft 301 to the outer edge of the base 101.

In the base 101, a second hole 521 is formed as a part of the hole 501 so as to have an opening that opens to the lower surface 121 of the base 101 and so as to be connected to the first hole 511.

According to the second embodiment, an upper end portion of the second hole 521 is connected to an end portion of the first hole 511 that is located above the enlarged-diameter portions 341. The first hole 511, however, may extend to a central portion of the base 101, and an intermediate portion thereof may be connected to the upper end portion of the second hole 521.

The opening of the second hole 521 is located on an interface between the lower surface 121 of the base 101 and the upper end surface 311 of the shaft 301.

In the shaft 301, a third hole 531 is formed as a part of the hole 501. The third hole 531 is formed inside a peripheral wall portion of the shaft 301 and, according to the second embodiment, in the vertical direction. A lower end portion of the third hole 531 opens to the lower end surface 321 of the shaft 301. An upper end portion of the third hole 531 is located on the interface between the upper end surface 311 of the shaft 301 and the lower surface 121 of the base 101 and is connected to the opening of the second hole 521. Thus, the third hole 531 extends through the cylindrical portion 331 of the shaft 301 in the vertical direction.

The first, second, and third holes 511, 521, and 531 are formed such that the axes L11, L21, and L31 thereof are linear. The first, second, and third holes 511, 521, and 531 have the same sectional shape or similar sectional shapes and, according to the second embodiment, the sectional shape thereof is a circular shape. The first, second, and third holes 511, 521, and 531 may have different sectional shapes, and the sectional shape thereof may be a polygonal shape such as a rectangular shape or an elliptical shape instead of a circular shape.

In the base 101, a depth H1 of the second hole 521 from an imaginary plane S1 including the lower surface 121 of the base 101 gradually increases in a direction in which the first hole 511 extends. According to the second embodiment, the axis L21 of the second hole 521 is linear, and the depth H1 gradually increases at a constant rate from the imaginary plane S1 in the first direction, that is, in the direction to the outer edge of the base 101. The axis L21 of the second hole 521 is thus inclined at a predetermined angle with respect to the axes L11 and L31 of the first and third holes 511 and 531, for example, at 135 degrees in FIG. 5. The axis L21 of the second hole 521 may be inclined at different angles with respect to the axes L11 and L31 of the first and third holes 511 and 531.

The axis L21 of the second hole 521 may be defined by a combination of straight lines so as to have corners bent at an obtuse angle. In particular, the axis L21 of the second hole 521 is preferably defined by a combination of a straight line that is connected to the axis L31 of the third hole 531 and that forms a corner bent at 150 degrees (obtuse angle) between the straight line and the axis L31 and a straight line that forms a corner bent at 150 degrees (obtuse angle) between the straight lines.

An operator inserts the thermocouple 401 from the opening of the third hole 531 at the lower end surface 321 of the shaft 301 into the inside of the hole 501 in the ceramic heater 1001 having the above structure.

When inserted, the thermocouple 401 first enters the third hole 531 straight upward, bends at a bent portion between the second hole 521 and the third hole 531, for example, at 45 degrees according to the second embodiment, and heads diagonally upward toward an end of the second hole 521 along the upper surface of the second hole 521.

Subsequently, the thermocouple 401 bends at a boundary between the first hole 511 and the second hole 521, for example, at 45 degrees according to the second embodiment, and heads outward toward an end of the first hole 511 along the upper surface of the first hole 511. When the end portion of the thermocouple 401 reaches the end of the first hole 511, insertion of the thermocouple 401 is completed.

Thus, the thermocouple 401 is readily inserted up to the end along the inner wall surface of the first, second, third holes 511, 521, and 531. The thermocouple 401 has two bent portions at the boundaries between the first, second, third holes 511, 521, and 531. An angle at which the bent portions bend is 45 degrees, and a long distance is ensured between the bent portions.

This enables the thermocouple 401 to be disposed in a region located outside the shaft 301 in a top view unlike the case of the technique disclosed in PTL 1 described above. As compared with the technique disclosed in PTL 2 described above, there is no members, such as a guide, in the shaft 301, and a large number of the thermocouples 401 can be disposed therein.

A ceramic heater 1001A corresponding to a holding apparatus according to a modification to the second embodiment of the present invention will now be described with reference to FIG. 6.

The difference between the ceramic heater 1001A and the above ceramic heater 1001 is a hole 501A only, and a description of the other structures is omitted.

First and third holes 511 and 531 of the hole 501A are the same as the first and third holes 511 and 531 of the hole 501.

A second hole 521A of the hole 501A has an opening that opens to the lower surface 121 of the base 101 and is formed so as to be connected to the first hole 511 as in the case of the second hole 521 of the hole 501. In the base 101, a depth H1 of the second hole 521A from an imaginary plane S1 that is along the upper surface 111 of the base 101 gradually increases in the direction to the outer edge of the base 101.

The second hole 521A differs from the above second hole 521 and is in the form of a groove. Specifically, a projected region of the second hole 521A in the direction from the upper surface 111 of the base 101 to the lower surface 121 matches a region in which the opening of the second hole 521A at the lower surface 121 of the base 101 is formed.

In the case where the second hole 521A is thus formed, the second hole 521A, which is in the form of a groove, can be more readily processed than the second hole 521, which needs a drilling process from a diagonal direction.

When the thermocouple 401 is inserted, the thermocouple 401 moves while being in contact with the upper surface of the second hole 521A, and the thermocouple 401 is readily inserted as in the above second embodiment.

The second hole 521A may be partially in the form of a groove, and the projected region of the second hole 521A in the direction from the upper surface 111 of the base 101 to the lower surface 121 may be contained in a region in which the opening of the second hole 521A at the lower surface 121 of the base 101 is formed, although this is not illustrated.

A ceramic heater 1001B corresponding to a holding apparatus according to another modification to the second embodiment of the present invention will now be described with reference to FIG. 7.

The difference between the ceramic heater 1001B and the above ceramic heater 1001A is a hole 501B only, and a description of the other structures is omitted.

First and third holes 511 and 531 of the hole 501B are the same as the first and third holes 511 and 531 of the hole 501A.

A second hole 521B of the hole 501B has an opening that opens to the lower surface 121 of the base 101 and is formed so as to be connected to the first hole 511 as in the case of the second hole 521A of the hole 501A. In the base 101, a depth H1 of the second hole 521B from the imaginary plane S1 gradually increases in the direction to the outer edge of the base 101.

Although the upper wall surface of the second hole 521A of the hole 501A extends linearly over the entire length, the upper wall surface of the second hole 521B bends at a location, and two parts thereof extend linearly.

The upper wall surface of the second hole 521B at a boundary between the second hole 521B and the first hole 511 is inclined at 30 degrees with respect to the axis L11 of the first hole 511 and the upper wall surface of the first hole 511. The upper wall surface of the second hole 521B at a boundary between the second hole 521B and the third hole 531 is inclined at 30 degrees with respect to the axis L31 of the third hole 531. Thus, the upper wall surface of the second hole 521B bends at 30 degrees, and two parts thereof extend linearly.

However, the upper wall surface of the second hole 521B is not limited to the case where upper wall surface bends at a location with respect to the upper wall surface of the first and third holes 511 and 531 and two parts thereof extend linearly. The upper wall surface of the second hole 521B may continuously extend linearly with respect to the upper wall surface of the first hole 511 or the wall surface of the third hole 531. The upper wall surface of the second hole 521B may bend at an angle at two or more locations, and three or more parts thereof may extend linearly.

In the case where the second hole 521B is thus formed, an angle at which the thermocouple 401 bends in the second hole 521 can be further increased, and the thermocouple 401 can be readily inserted.

The upper wall surface of the second hole 521B may partially extend linearly parallel to the upper surface 111 of the base 101.

A ceramic heater 1001C corresponding to a holding apparatus according to another modification to the second embodiment of the present invention will now be described with reference to FIG. 8.

The difference between the ceramic heater 1001C and the above ceramic heater 1001A is a shaft 301C and a hole 501C only, and a description of the other structures is omitted.

The shaft 301C does not include the enlarged-diameter portion 341 of the shaft 301 at the upper end portion. The shaft 301C is joined to the lower surface 121 of the base 101 at the upper end surface 311 of the cylindrical portion 331.

First and third holes 511 and 531 of the hole 501C are the same as the first and third holes 511 and 531 of the hole 501A.

A second hole 521C of the hole 501C has an opening that opens to the lower surface 121 of the base 101 and is formed so as to be connected to the first hole 511 as in the case of the second hole 521A of the hole 501A. In the base 101, a depth H1 of the second hole 521C from the imaginary plane S1 gradually increases in the direction to the outer edge of the base 101.

The opening of the second hole 521C at the lower surface 121 of the base 101, which differs from the opening of the second hole 521A of the hole 501A that opens within the interface between the base 101 and the shaft 301, also opens to an inner side of the interface between the lower surface 121 of the base 101 and the shaft 301C, that is, an inner side of the cylindrical portion 331 of the shaft 301C.

In the case where the second hole 521C is thus formed, the present invention can be used even when the interface between the base 101 and the shaft 301C is narrow, for example, the shaft 301 does not include the enlarged-diameter portion 341 at the upper end portion.

In the case where the ceramic heater 1001C is used, for example, for a semiconductor manufacturing apparatus, a process gas does not enter the shaft 301C even when a part of the hole 501C is in communication with the inside of the shaft 301C as above, and the thermocouple 401 is not affected by a process gas.

Although the upper wall surface of the second hole 521A of the hole 501A extends linearly over the entire length, the upper wall surface of the second hole 521C is curved.

The upper wall surface of the second hole 521C at a boundary between the second hole 521C and the first hole 511 is formed so as to be continuous with the upper wall surface of the first hole 511. The upper wall surface of the second hole 521C at a boundary between the second hole 521C and the third hole 531 is formed so as to be continuous with the wall surface of the third hole 531. The upper wall surface of the second hole 521C therebetween is smoothly curved.

However, the upper wall surface of the second hole 521C is not limited to continuously extending to the upper wall surface of the first and third holes 511 and 531. The upper wall surface of the second hole 521C may continuously extend to the upper wall surface of either the first hole 511 or the third hole 531. The upper wall surface of the second hole 521C may partially extend linearly.

In the case where the second hole 521C is thus formed, an angle at which the thermocouple 401 bends in the second hole 521C can be further increased, and the thermocouple 401 can be readily inserted.

Although the second embodiment of the present invention is described above, the present invention is not limited thereto.

For example, the present invention is not limited to the case where the third hole 531 opens to the lower end surface 321 of the shaft 301 as described above, and the third hole 531 may open to the inner surface of the shaft 301.

The present invention is not limited to the cases where the ceramic heater includes the shaft 301 or 301C as described above. The ceramic heater may include no shaft.

EXAMPLES

Example 1

An aluminum nitride disk-shaped base having a diameter of 340 mm and a thickness of 25 mm was prepared as the base 101.

In the base 101, the resistive heating elements 201 were embedded at a position 10 mm away from the upper surface, which was 40% of the thickness of the base 101, and each resistive heating element 201 was made of 50 meshes of pure molybdenum wires having a diameter of 0.1 mm.

The first hole 511 extending linearly parallel to the upper surface 111 was formed in the base 101 at a position 15 mm away from the upper surface, which was 60% of the thickness of the base 101. The sectional shape of the first hole 511 was a square whose side was 2 mm in length. An end of the first hole 511 was located at a position 130 mm away from the center of the base 101, and the other end on the central side was located at a position 28 mm away from the center of the base 101.

The first hole 511 was formed in a manner in which two plates, of which the base 101 was to be formed, were joined to each other. More specifically, one of the plates having a thickness of 15 mm was first manufactured such that the resistive heating elements 201 were embedded therein. A groove with a side length of 2 mm and a depth of 2 mm for forming the first hole 511 was formed on a surface of the plate.

Subsequently, the other plate having a thickness of 10 mm was placed on the surface of the plate on which the groove was formed. The two plates were formed into one piece by diffusion welding. Thus, the base 101 having the first hole 511 was formed.

Figure 6:
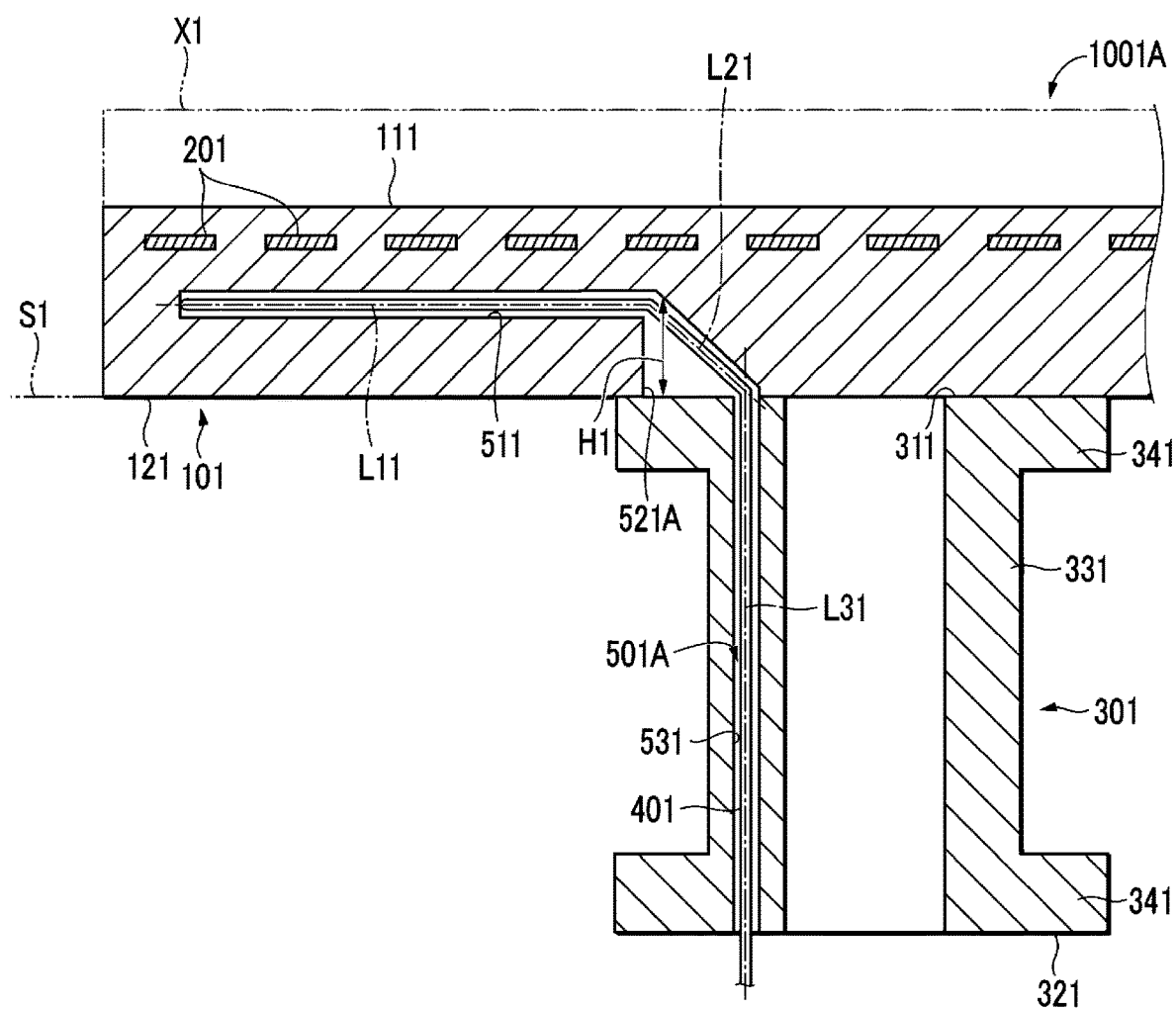
FIG. 6 is a schematic sectional view of a ceramic heater according to a modification to the second embodiment of the present invention.

Referring to FIG. 6, the second hole 521A was formed in the base 101 by cutting work.

The second hole 521A was in the form of a groove, the width thereof was 2 mm, the length of the groove was 12 mm, and an angle formed between the upper wall surface thereof and the upper wall surface of the first hole 511 was 135 degrees.

The material of the shaft 301 was prepared. The material had a thermal conductivity less than that of the base 101 and was aluminum nitride having a thermal conductivity of 80 kW/(m·k) at normal temperature. The shaft 301 included the cylindrical portion 331 having an inner diameter of 50 mm, an outer diameter of 60 mm, and a length of 200 mm and the enlarged-diameter portions each having an outer diameter of 70 mm and a thickness of 10 mm at the upper end portion and the lower end portion.

The third hole 531 extending from the upper end surface 311 to the lower end surface 321 was formed in the cylindrical portion 331 of the shaft 301. The sectional shape of the third hole 531 was a circle with a diameter of 3 mm.

A central portion of the upper end surface of the shaft 301 was joined to a central portion of the lower surface 121 of the base 101 by a diffusion welding method to manufacture the ceramic heater 1001A.

The thermocouple 401 was inserted into the ceramic heater 1001A from the opening of the lower end portion of the third hole 531. The thermocouple 401 was a K-type thermocouple including a sheath made of SUS316L with a diameter of 1.6 mm.

The thermocouple 401 was readily inserted. After the thermocouple 401 was inserted up to the end of the first hole 511, the thermocouple 401 was extracted. Visual inspection of the thermocouple 401 revealed that the thermocouple 401 was not damaged.

Example 2

The ceramic heater 1001B was manufactured in the same manner as in the example 1 except for the shape of the second hole 521B.

Figure 7:
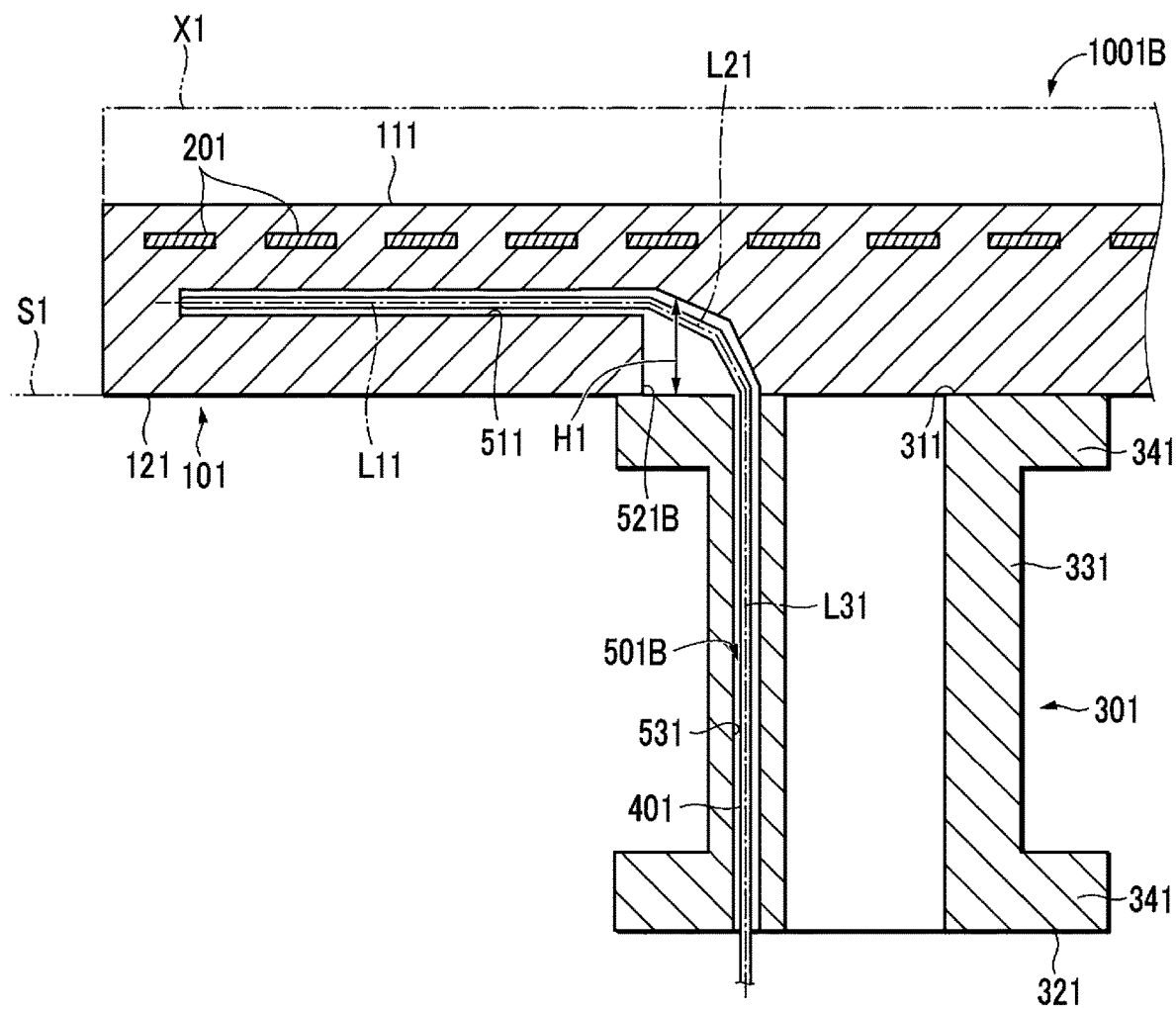
FIG. 7 is a schematic sectional view of a ceramic heater according to another modification to the second embodiment of the present invention.

Referring to FIG. 7, the second hole 521B was in the form of a groove, the width thereof was 2 mm, and the length of the groove was 12 mm. A portion of the upper wall surface of the second hole 521B that was continuous with the upper wall surface of the first hole 511 was inclined at 30 degrees with respect to the upper wall surface of the first hole 511 and extended linearly. A portion of the upper wall surface of the second hole 521B that was continuous with the wall surface of the third hole 531 was inclined at 30 degrees with respect to the wall surface of the third hole 531 and extended linearly. The portions extending linearly were connected to each other at an angle of 150 degrees.

The same thermocouple 401 as in the example 1 was inserted into the ceramic heater 1001B thus manufactured from the opening of the lower end portion of the third hole 531.

The thermocouple 401 was readily inserted. After the thermocouple 401 was inserted up to the end of the first hole 511, the thermocouple 401 was extracted. Visual inspection of the thermocouple 401 revealed that the thermocouple 401 was not damaged.

Example 3

The ceramic heater 1001 was manufactured in the same manner as in the example 1 except for the shape of the second hole 521B.

The second hole 521B was in the form of a groove, the width thereof was 2 mm, and the length of the groove was 12 mm. The upper wall surface of the second hole 521B was curved with a radius of 12 mm.

The same thermocouple 401 as in the example 1 was inserted into the ceramic heater 1001 thus manufactured from the opening of the lower end portion of the third hole 531.

The thermocouple 401 was readily inserted. After the thermocouple 401 was inserted up to the end of the first hole 511, the thermocouple 401 was extracted. Visual inspection of the thermocouple 401 revealed that the thermocouple 401 was not damaged.

Example 4

The ceramic heater 1001C was manufactured in the same manner as in the example 3 except for the shaft 301C.

Figure 8:
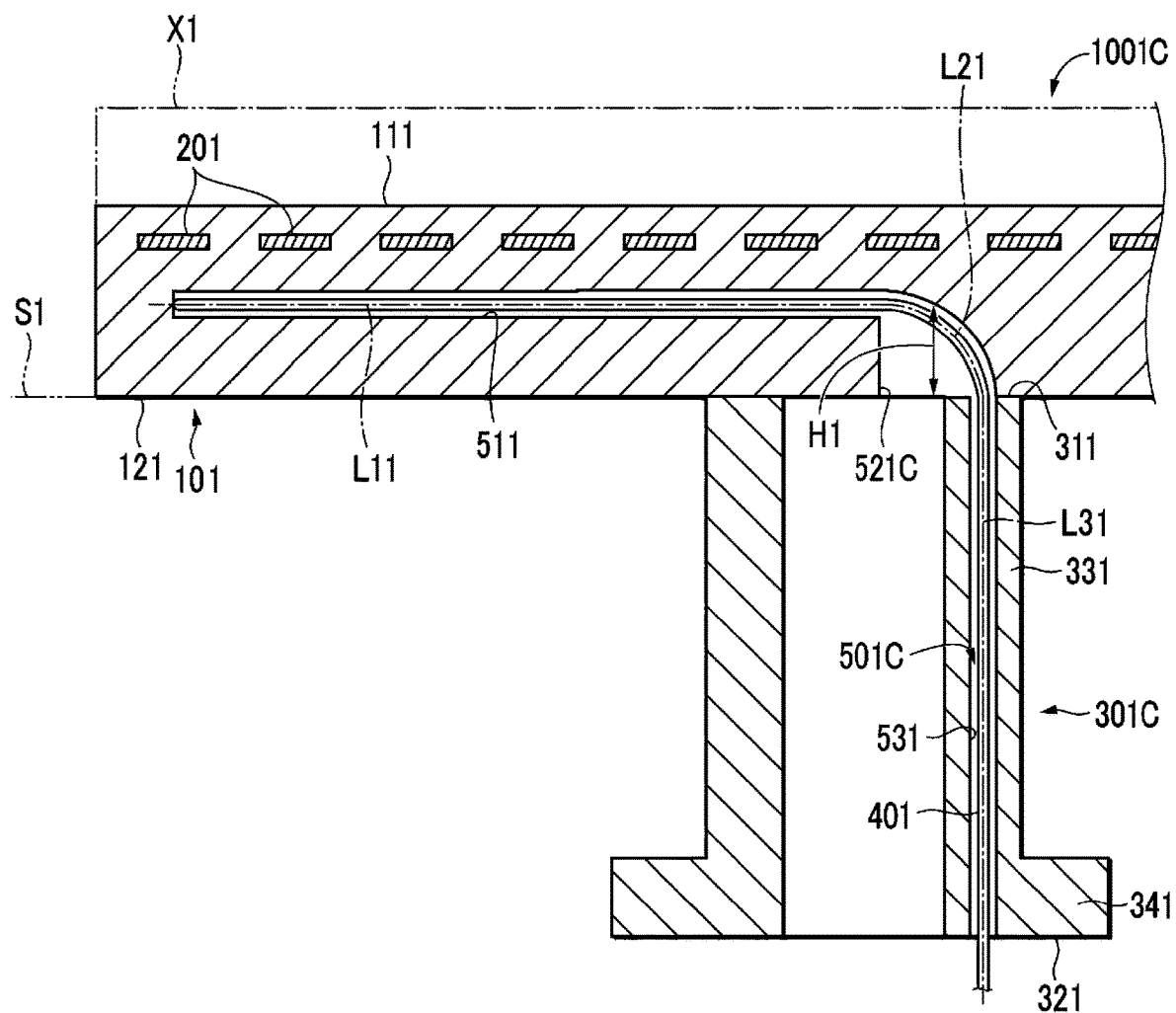
FIG. 8 is a schematic sectional view of a ceramic heater according to another modification to the second embodiment of the present invention.

Referring to FIG. 8, the shaft 301C including no enlarged-diameter portion 341 at the upper end portion was prepared. A part of the opening of the second hole 521C at the lower surface 121 of the base 101 was in communication with an inner side of the cylindrical portion 331 of the shaft 301.

The same thermocouple 401 as in the example 1 was inserted into the ceramic heater 1001C thus manufactured from the opening of the lower end portion of the third hole 531.

The thermocouple 401 was readily inserted. After the thermocouple 401 was inserted up to the end of the first hole 511, the thermocouple 401 was extracted. Visual inspection of the thermocouple 401 revealed that the thermocouple 401 was not damaged.

What is claimed is:
1. A holding apparatus, comprising:
a plate-shaped base made of ceramics, the base having an upper surface and a lower surface opposite the upper surface;
a tubular shaft consisting of a unitary member made of ceramics, the shaft having an upper end surface and a lower end surface opposite the upper end surface, the upper end surface of the shaft connected to the lower surface of the base such that all of the upper end surface of the shaft which is connected to the lower surface of the base is in a same plane; and a resistive heating element embedded in the base;

wherein an object is held on the upper surface of the base;

wherein the base defines a first hole extending in a first direction parallel to the upper surface of the base;

wherein the shaft defines a second hole extending from the lower end surface or an inner surface of the shaft toward the upper end surface;

wherein a third hole is defined continuously between the base and the shaft, the third hole connecting the first hole and the second hole;

wherein an imaginary plane passes through a boundary between the second hole and the third hole and is parallel to the upper surface of the base, and a distance of the third hole from the imaginary plane gradually increases in the first direction; and wherein a thermocouple extends through the first hole, the second hole, and the third hole such that the thermocouple is surrounded by the base and the tubular shaft.

2. The holding apparatus according to claim 1, wherein a part of the third hole defined by the base has an opening at the lower surface of the base; and wherein a projected region of the part of the third hole defined by the base in a direction from the upper surface of the base to the lower surface is contained in a region of the opening.

3. The holding apparatus according to claim 1, wherein the second hole extends from the lower end surface to the upper end surface;

wherein the third hole connects to the second hole at a middle area of the second hole; and wherein a part of the second hole that is located above a boundary between the second hole and the third hole is filled with a member different from the shaft.

4. The holding apparatus according to claim 1, wherein a part of the third hole defined by the base has a linear first axis, a part of the third hole defined by the shaft has a linear second axis, and an angle formed between the first direction and a direction of the first axis is less than an angle formed between the first direction and a direction of the second axis.

5. A holding apparatus, comprising:

a plate-shaped base made of ceramics, the base having an upper surface and a lower surface opposite the upper surface;

a tubular shaft consisting of a unitary member made of ceramics, the shaft having an upper end surface and a lower end surface opposite the upper end surface, the upper end surface of the shaft connected to the lower surface of the base such that all of the upper end surface of the shaft which is connected to the lower surface of the base is in a same plane; and a resistive heating element embedded in the base;

wherein an object is held on the upper surface of the base;

wherein the base defines a first hole extending in a first direction along the upper surface of the base;

wherein the base defines a second hole that is connected to the first hole and has an opening at the lower surface of the base;

wherein an imaginary plane includes the lower surface of the base, and a distance of the second hole from the imaginary plane gradually increases in the first direction; and wherein a thermocouple extends through the first hole and the second hole such that the thermocouple is surrounded by the base and the tubular shaft.

6. The holding apparatus according to claim 5, wherein a projected region of the second hole in a direction from the upper surface of the base to the lower surface is contained in a region of the opening.

7. The holding apparatus according to claim 5, wherein the shaft defines a third hole extending from the lower end surface or an inner surface of the shaft toward the upper end surface, the third hole connected to the second hole such that the thermocouple extends through the third hole.

* * * * *